United States Patent [19]

Huber

[11] 4,331,914

[45] May 25, 1982

[54] LOAD CONTROL AND SWITCHING CIRCUITS

[75] Inventor: Paul G. Huber, Pawpucket, R.I.

[73] Assignee: General Electric Company, Schenectady, N.Y.

[21] Appl. No.: 181,811

[22] Filed: Aug. 27, 1980

[51] Int. Cl.³ .............................................. H03K 17/30
[52] U.S. Cl. .................... 323/324; 307/252 B; 315/199; 315/291
[58] Field of Search .............. 323/239, 242, 300, 320, 323/322, 324, 325, 326; 307/252 B; 315/199, 194, 291

[56] References Cited

U.S. PATENT DOCUMENTS

| | | | |
|---|---|---|---|
| 2,082,947 | 6/1937 | Fotsch | 403/393 X |
| 2,205,322 | 6/1940 | Thomas, Jr. et al. | 403/393 X |
| 2,888,656 | 5/1959 | Bremer | 338/261 |
| 2,961,632 | 11/1960 | Nachmeister et al. | 339/136 R |
| 3,113,284 | 12/1963 | Van Inthoudt | 338/274 |
| 3,161,759 | 12/1964 | Gambill et al. | 323/239 |
| 3,252,122 | 5/1966 | Baxter | 338/271 |
| 3,310,769 | 3/1967 | Simmons | 338/241 |
| 3,582,616 | 6/1971 | Wrog | 219/541 |
| 3,881,163 | 4/1975 | Lindroth et al. | 338/302 |
| 3,935,505 | 1/1976 | Spiteri | 315/291 |
| 4,061,961 | 12/1977 | Baker | 323/239 |
| 4,167,786 | 9/1979 | Miller et al. | |
| 4,173,754 | 11/1979 | Feiker | |
| 4,185,272 | 1/1980 | Feiker | |
| 4,213,182 | 7/1980 | Eichelberger et al. | |
| 4,258,276 | 3/1981 | Beling | 307/252 B |

FOREIGN PATENT DOCUMENTS

| | | | |
|---|---|---|---|
| 2163622 | 6/1973 | Fed. Rep. of Germany | 323/324 |
| 2264153 | 7/1974 | Fed. Rep. of Germany | 338/274 |
| 2416620 | 10/1975 | Fed. Rep. of Germany | 338/274 |
| 2539600 | 3/1977 | Fed. Rep. of Germany | 307/252 B |
| 624422 | 6/1949 | United Kingdom | 338/274 |

Primary Examiner—William H. Beha, Jr.
Attorney, Agent, or Firm—Geoffrey H. Krauss; James C. Davis, Jr.; Marvin Snyder

[57] ABSTRACT

Intelligent load control and switching circuits for facilitating the switching and control of the power consumption level of at least one power-consuming load, responsive to a signal, having a programmable amplitude or programmable pulse-width, provided thereto. The load control and switching circuit not only controls the coupling of a power source to a power-consuming load, but also controls the portion of the source waveform cycle during which the load is coupled to the source, to control the average power consumption thereof. Several embodiments of load control and switching circuitry, as well as power supplies for providing operating potential thereto, as disclosed.

18 Claims, 10 Drawing Figures

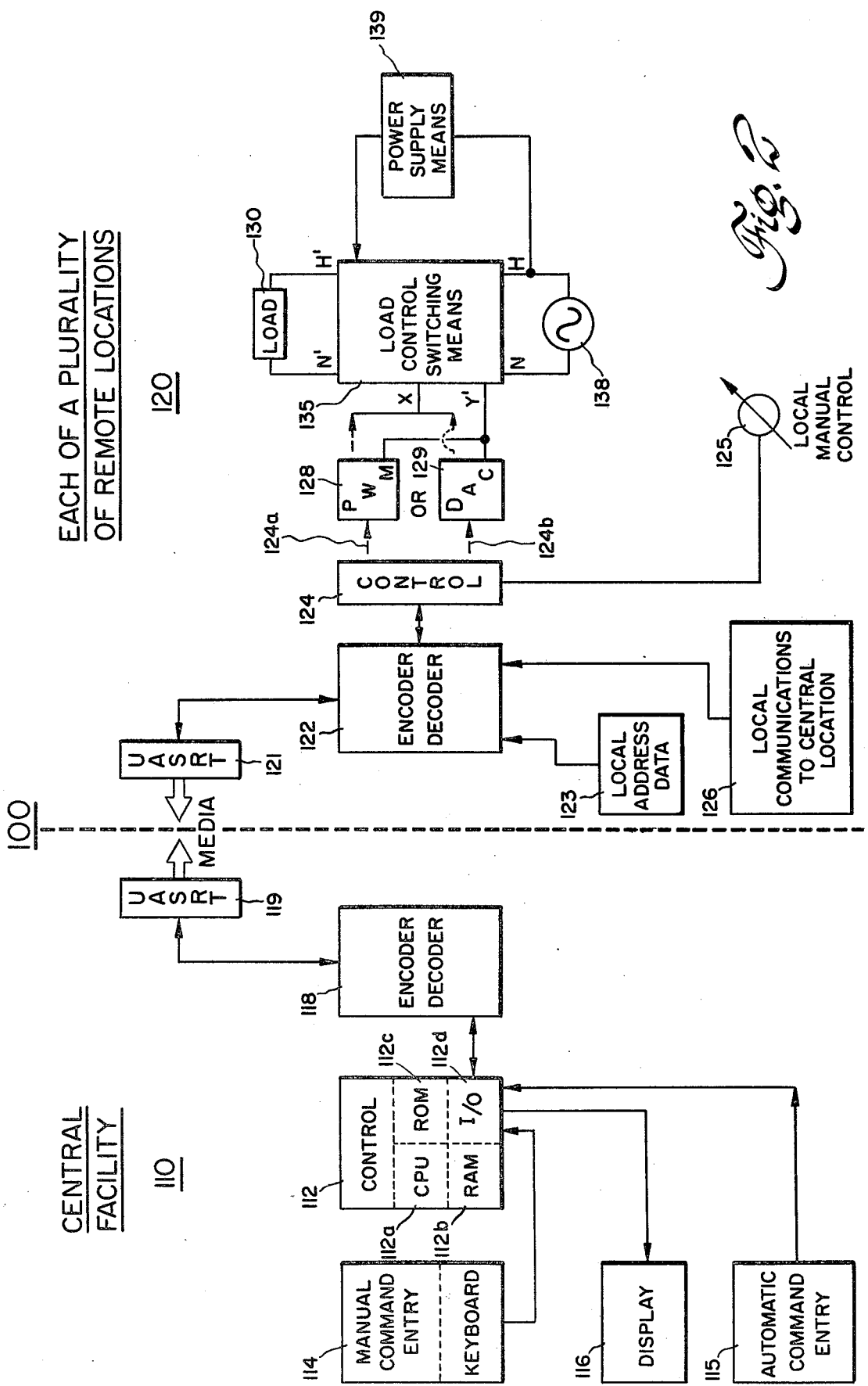

LOAD CONTROL AND SWITCHING CIRCUITS

BACKGROUND OF THE INVENTION

The present invention relates to load control and switching circuits and, more particularly, to novel remotely controllable circuits for controlling the presence and amplitude of power consumed by a load.

It is desirable to actuate each of a plurality of power-consuming loads, and to set the power-consumption level thereof, from a central control facility. Switching and control of the power-consuming loads are advantageously commanded both manually and on a programmed basis. Further, a system allowing such load activation and level control will advantageously provide a common transmission medium between the central facility and all of the plurality of remote locations, to reduce cost of the system. For example, all of the lights in a residence may be controlled by a central facility allowing the light level in each room of the residence to be adjusted on a time-of-day schedule, while further providing for manual intervention from specific locations (such as at the house entrance or in the master bedroom) for controlling all light sources within that residence.

Heretofore, individual wiring, between remote switches and each load to be energized and level controlled, was commonly utilized. More recently, centrally-programmable load switching systems have been utilized for the purpose of enabling and disabling current flow through a particular load; active control of the power consumption of a single load has not been hitherto possible in programmable, central-control systems. Accordingly, remotely load control and switching circuits for use in such a system, are highly desirable.

BRIEF SUMMARY OF THE INVENTION

In accordance with the invention, a load control and switching circuit for controlling power consumption in each of at least one load coupled thereto, includes a gateable, bidirectionally-conductive device, gated by either a single symmetrically-conductive device, or a pair of asymmetrically-conductive devices, responsive to a control signal. The control signal may be either the pulse-width of an analog pulse-width-modulated signal, or the amplitude of an analog D.C. voltage control signal. The chosen one of the pulse-width-modulated or variable-amplitude signals is furnished at the input to the load control and switching means.

In presently preferred embodiments, one of the photo-resistive element or an asymmetrically-conductive device is utilized to gate the load-current-control element, also responsive to the control signal developed responsive to the commands received from a central facility.

Accordingly, it is one object of the present invention to provide novel load control and switching circuits for switching and controlling the power-consumption of a load connected thereto.

This and other objects of the present invention will become apparent to those skilled in the art upon consideration of the following detailed description, when taken in conjunction with the drawings.

BRIEF DESCRIPTION OF THE DRAWINGS

FIG. 2 is a block diagram of a programmable load control and switching system, in which the novel load switching and control circuits of the present invention may be used;

DETAILED DESCRIPTION OF THE INVENTION

Figure 1:
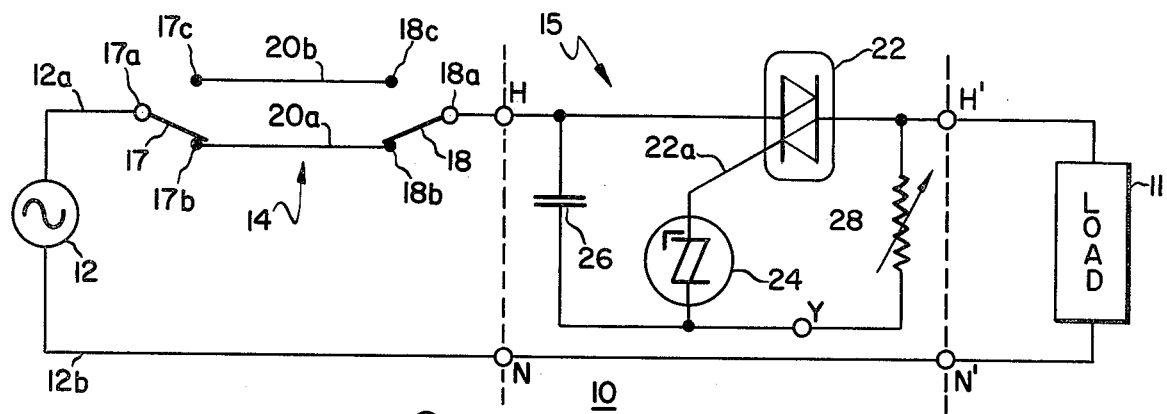
FIG. 1 is a schematic diagram of a prior art means for switchable connecting a power-consuming load to a power source, and other prior art means for manually controlling the power-consumption level of the load.

Referring initially to FIG. 1, a prior art load control circuit 10, for controlling the magnitude of average power applied to a load 11 from a sinusoidal power source 12, comprises a power switching section 14 and a power magnitude control section 15 in series electrical connection in the hot line 12a from the source to the hot line connection H' of the load. The neutral terminal 12b of the source is connected via neutral wire N directly to the neutral connection of the load. Power control section 14, as is well-known in the art, may consist of a single-pole, single-throw switch if load control from a single location is desired. Where power switching from each of a pair of central locations is desired, a pair of single-pole, double-throw switch means 17 and 18 (as illustrated) are used. The switch means each have a common terminal 17a and 18a, respectively connected to the hot line 12a from the source and to the hot line input H of the magnitude control section 15. Like switch contacts 17b and 18b or 17c and 18c are connected together by intermediate wire 20a and 20b, respectively, to allow connection of the source hot line 12a to the hot input H of the power control unit for switching power from each of the pair of locations. Other well-known schemes may be used for allowing power to be switched, from a plurality of locations, between a source and a load. Average power magnitude control section 15 includes a gateable device 22, such as a triac and the like, having a controlled main circuit in series with the line and conducting responsive to the signal at a gate control electrode 22a thereof. Typically, a four-layer triggering device 24 is connected between gate electrode 22a and the control point Y of a variable-phase-shift network, including a capacitance element 26 and a variable resistance 28. The remaining terminals of device 22 are respectively connected to the hot line input H and the hot line output H' of the magnitude control means 15. As is well-known, adjustment of the magnitude of variable resistance 28 changes the phase angle of the A.C. waveform at triggering device 24, causing device 24 to conduct at an adjustable time, in each cycle, after a zero crossing of the source waveform. When device 24 conducts, a gating signal is applied to the gate electrode 22a of the series device 22, allowing current to be drawn by the load during a variable portion of the sinusoidal waveform of the power supply, thus varying the average current, and power, drawn by load 11. It will be seen that the load power magnitude may be adjusted from only one physical location (that location at which variable resistance 28 is located) even if the power switching arrangements of section 14 are replaced by remote-control apparatus of either manually or automatically actuated type. It is therefore desirable to be able to control the average power magnitude of the load independently from more than one location, as required in a multi-location power control system. It is also desirable to provide a load power magnitude control unit capable of external control.

One preferred system 100 for controlling load power, for example, to dim the luminous output of a plurality of incandescent lighting sources, from, and at, each of a multiplicity of locations, is shown in FIG. 2. The system, which is described and claimed in copending application Ser. No. 181,812, assigned to the assignee of the present application and incorporated herein by reference, comprises a central facility 110, at which is located a control computer 112. Computer 112 include a central processing unit 112a interconnected with random-access memory (RAM) 112b and read-only memory (ROM) 112c, of sufficient storage space for storing data and addresses of a desired plurality of remote loads, and an input-output section (I/O) 112d. The I/O section allows a manual command entry keyboard 114 and an automatic command entry means 115 (which may be tape, disc, and the like mass storage means) to provide information to the control computer means, and to provide data to a display means 116. A digital encoder and decoder means 118 is connected for two-way communication with I/O section 112. The distinct address of each of the plurality of remote locations, as well as the data to be transmitted thereto, is received from the I/O section and encoded into the particular transmission format utilized by encoder-decoder means 118. The encoded data is then provided to a universal asynchronous-synchronous receiver transmitter means (UASRT) 119, for communication via a selected transmission media to all of the plurality of remote locations. Similarly, encoded data from a remote location is received by UASRT 119, from the transmission media, and is provided to encoder-decoder means 118 for decoding, and subsequent presentation to the I/O section 112d of the central control computer means 112.

At each of a plurality of remote locations 120, a universal asynchronous-synchronous receiver transmitter means (UASRT) 121 receives the encoded address and data transmission from the media and provides the received transmission to an encoder-decoder means 122. The incoming transmission is decoded and the address portion of the transmission is checked against local address data stored in local address data means 123 (which may be a switch matrix, read-only memory or the like apparatus). If the local address data corresponds to the address sent as part of a particular transmission, decoder means 122 provides the data portion of that transmission to a control means 124. Similarly, data from each local control means 124, which data may be modified by an associated local manual control means 125 for varying the magnitude of power applied to a local load 130, is provided to encoder-decoder means 122, in addition to local address data from local address data means 123 and communications data provided by a local communications-to-central-location means 126. The local address data (supplied by means 123) and any additional data supplied by one or both of local manual control means 125 or local communications means 126, is encoded in means 122 and provided to UASRT 121. The encoded address and data transmission is then sent via the transmission media to central facility 110. At the central facility, UASRT 119 provides the incoming data to encoder-decoder means 118 for subsequent presentation to the control computer means 112, as previously described hereinabove. It should be understood that the heretofore described portions of the load power control system may be provided by systems such as are described and claimed in U.S. Pat. No. 4,167,786, issued Sept. 11, 1979; U.S. Pat. No. 4,173,754, issued Nov. 6, 1979; U.S. Pat. No. 4,185,272, issued Jan. 2, 1980; or U.S. Pat. No. 4,213,182, issued July 15, 1980, all of which patents are incorporated herein in their entirety by reference. Accordingly, it should be understood that any system having a central facility providing each of a plurality of remote locations with data sufficient to provide each unique-local-address remote location with a control data output at the outputs of control means 124, is equally as well utilizable for that portion of the system shown in FIG. 2.

Connected to one of outputs 124a or 124b of control means 124 is a means, such as a pulse-width modulator (PWM) 128 or a digital-to-analog converter (DAC) 129 receiving the digital data, recovered from the transmission to the particular local address of that one of the plurality of remote locations, for conversion to a level-setting analog voltage. Thus, the digital data, available at that one of control outputs 127a or 127b utilized, preferably establishes the value a parameter of the output of that one of PWM means 128 or DAC means 129 utilized, whereby a signal is received at a control input X of a load control switching means 135, which signal has a programmable parameter, for example, programmable pulse-width in a fixed pulse-repetition-interval (if PWM means 128 is utilized) or programmable amplitude of a D.C. voltage (if DAC means 129 is utilized). The programmably-established parameter of the control voltage at switching means input X establishes the duration of the conduction time during each half-cycle of the waveform of A.C. power source 138. Load control means 135 may receive operating potential from a power supply means 139, preferably connected across the control means, i.e. effectively in series connection with load 130.

Figure 2A:
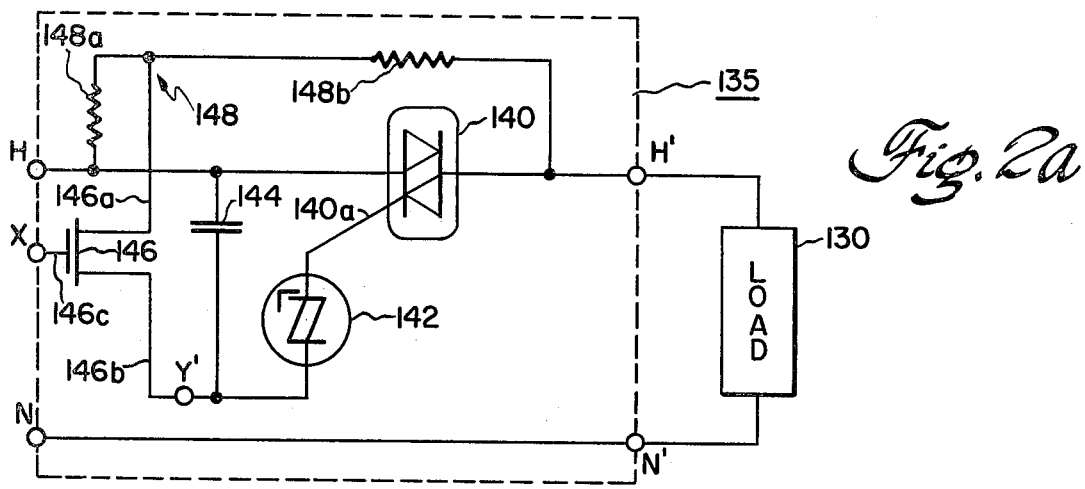
FIGS. 2a–2d are schematic diagrams of several presently preferred embodiments of load control and switching means usable in the system of FIG. 2.

In accordance with the invention, in one presently preferred embodiment for use in a remote lamp dimming embodiment of system 100, the "smart" or intelligent switch means 135 (which performs both the "on-off" switching function and a "dimming function") may be shown in FIG. 2a. A gateable device 140, such as a triac and the like, has its anode-cathode circuit connected in series between the hot line input H and the controlled hot line output H'. A four-layer triggering device 142 is connected between a gateable device gate electrode 140a and control point Y'. A capacitor 144 is connected between the hot line input H and control point Y'. A symmetrically-conducting device 146, such as a MOSFET and the like, provides a controlled resistance circuit, e.g. the drain-source circuit of the MOSFET, between hot line output H' and control point Y'. Presently available MOSFETs generally do not have a drain-source maximum voltage rating sufficient to withstand the peak voltage present between hot and neutral conductors in a commercial power distribution system, i.e. about 370 volts peak-peak on a standard 120 VAC. line. Accordingly, a resistive voltage divider 148, comprised of a first resistance element 148a connected between hot line input H and the semiconductor drain electrode 146a, and a second resistant element 148b connected between drain electrode 146a and hot output terminal H′, is utilized to drop the gateable device "off" voltage to a survivable level for the particular symmetrical semiconductor device 146 utilized. (Resistive divider 148 may also be used to limit the maximum available power duty cycle, as the "on" true interval of element 140 is limited by the product of capacitance C and the effective resistance of the divider.) The symmetrically conductive device has a gate electrode 146c connected to control terminal X, to receive the pulse-width-modulated or variable-amplitude analog voltage, respectively from PWM means 130 or DAC mens 132 (in FIG. 2). In a pulse-width modulated form of the system, the PWM means output waveform frequency is at least one (and preferrably at least two) orders of magnitude greater than the frequency of source 12, and the PWM means does not have to be synchronized with the source. Device 146 acts to control the SCR 140 emitter on or cut-off, with the minimum pulse-width "on" time is much less than the triac 140 conduction time interval dt, given by dt=(C/I) dV, where dV is the threshold voltage of diac 142, I is the saturation current of SCR 140 and C is the capacitance of capacitor 144.

Device 146 may also be operated so as to be substantially nonconductive during an initial portion of the pulse interval immediately after each zero crossing of the A.C. waveform the pulse interval now being, with as as long as coextensive with, a half-cycle of the A.C. waveform. At the termination of the nonconductive initial interval, the control input X voltage rises and causes device 146 to conduct for the remainder of the source half-cycle, until device 140 turns itself off at the end of the half-cycle, when the voltage across device goes to zero amplitude. Conduction of device 146 increases the control point Y′ voltage to be greater than the threshold voltage of trigger device 142, causing device 140 to conduct for a portion of each source waveform half-cycle thereby establishing the magnitude of current flowing through load 130.

In an analog-voltage-input form of the system, the voltage at control input X varies the source-drain channel resistance of device 146, to adjust the initial time, during each half-cycle of the source waveform, wherein the voltage across capacitor 144 is less than the threshold of trigger device 142; thus, gateable device 140 is caused to conduct current to load 130 only during a latter portion of each source waveform half-cycle, which latter portion varies in duration as a function of control input X voltage amplitude.

Figure 2B:
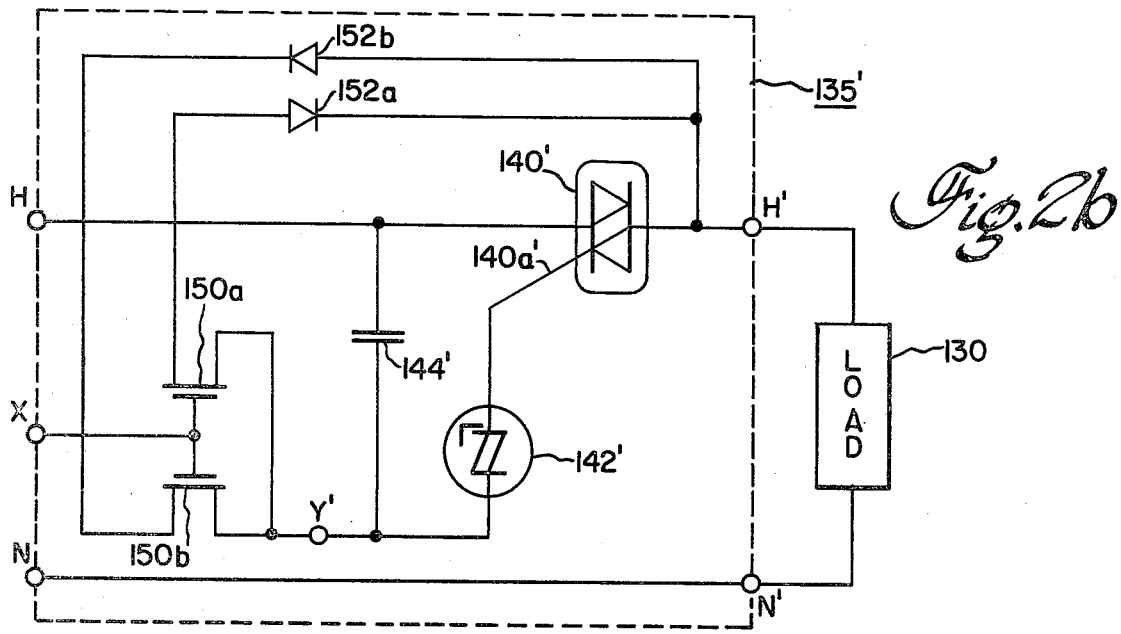
Figure 2C:
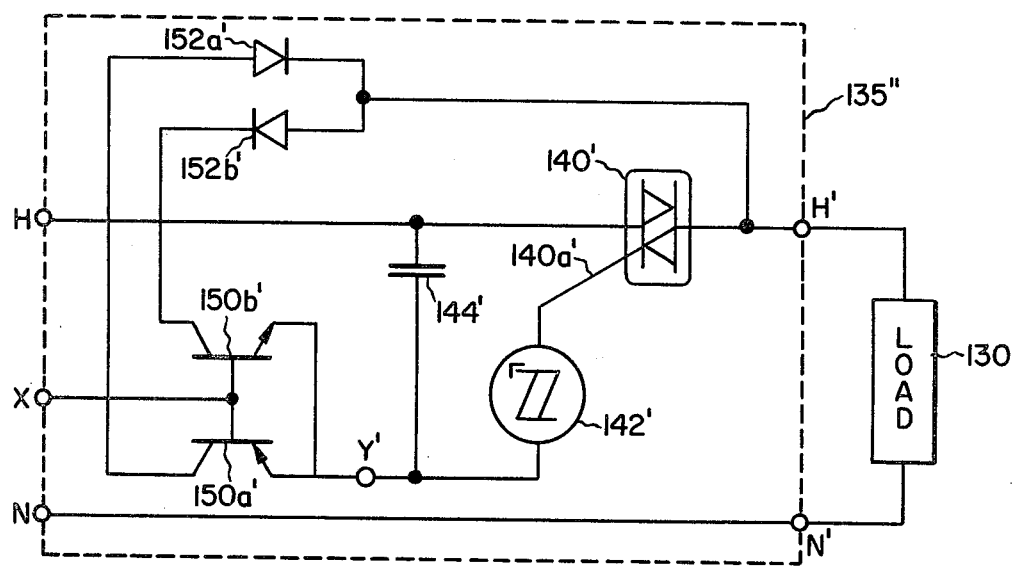

As shown in FIGS. 2b and 2c, other presently preferred load current switching means embodiments 135′ and 135″ each utilize a pair of asymmetrically-conducting devices, which may be VMOSFETs, JFETs, bipolar transistors and the like. In FIG. 2b, field-effect devices 150a and 150b each have a drain-source circuit connected between control point Y′ and control hot line output H′ via one of protection diodes 152a or 152b respectively. The gate electrodes of both devices 150a and 150b are tied in parallel to control input X. The use of a pair of asymmetrically-conducting VMOSFETs is desirable, as such VMOS devices are capable of handling a high voltage of a single polarity, whereby each of protection diodes 152a and 152b conduct on different halves of the A.C. source waveform; the remaining protection diode, e.g. diode 152a, is reverse-biased during the half cycle where a first diode, e.g. diode 152b, conducts, thereby protecting the associated device, e.g. device 150b, from reverse-voltage breakdown failure. The modes of operation are similar to the embodiment of FIG. 2a. That is, in a pulse-width-modulated system, during each half-cycle one of device 150a and 150b, e.g. device 150b, receives a control input voltage, during an initial portion of each half-cycle of the source waveform, such that conduction does not occur; during the remaining half-cycle portion, the voltage between control input X and control point Y′ is greater than the switching threshold of devices 150, causing one of devices 150 to heavily conduct during that portion of the half-cycle, whereby at some point in each source waveform half-cycle, conduction of one of devices 150a and 150b is initiated and a relatively rapid rise in voltage across capacitor 144′ causes device 142′ to trigger device 140 and allow current flow to the load during that remaining half-cycle portion. At the termination at each source waveform half-cycle, the voltage across device 140′ falls to zero, whereby the device 140′ returns to the nonconductive condition and remains nonconductive until the remaining switching device, e.g. device 150a, begins conduction at a corresponding point in a subsequent half-cycle to retrigger device 140′ to cause current to flow through load 130. Operation with a PWM frequency much greater than the frequency of source 12 can also be used.

It will be seen, by reference to FIG. 2c, that asymmetrical switching devices 150a′ and 150b′ may be bipolar transistors, rather than the asymmetrically-conducting field-effect transistors of FIG. 2b. Complementary polarity transistors are utilized, e.g. switching transistor 150a′ is a PNP device and switching transistor 150b′ is a NPN device, whereby, for a control voltage present between control input X and control point Y′, one of switching transistors 150a′ and 150b′ will conduct for a portion of alternating negative and positive polarity half-cycle of the source waveform. The conductive portion occurs for control voltage amplitudes which are greater than the base-emitter conduction voltage of the devices. Protection diodes 152a′ and 152b′ prevent reverse conduction in the associated switching transistor during the remaining half-cycles of the waveform. Thus, by adjustment of the amplitude of the analog current at control input X, with respect to control point Y′, the initial time interval of each half-cycle during which one of switching transistors 150a′ and 150b′ do not conduct is made adjustable. A simultaneous adjustment occurs in the ratio of conduction-to-total time interval during which current flows through gateable device 140′ to the load. Similarly, for a pulse-width-modulated input waveform, the initial portion thereof is of an amplitude sufficiently small to prevent either switching device 150a′ and 150b′ from conducting, with the time at which the input voltage obtains a larger magnitude of alternating plurality, causing one of the switching transistors to conduct, being controllable to control the portion of half-cycle time during which current is conducted through device 140′ to the load.

Figure 2D:
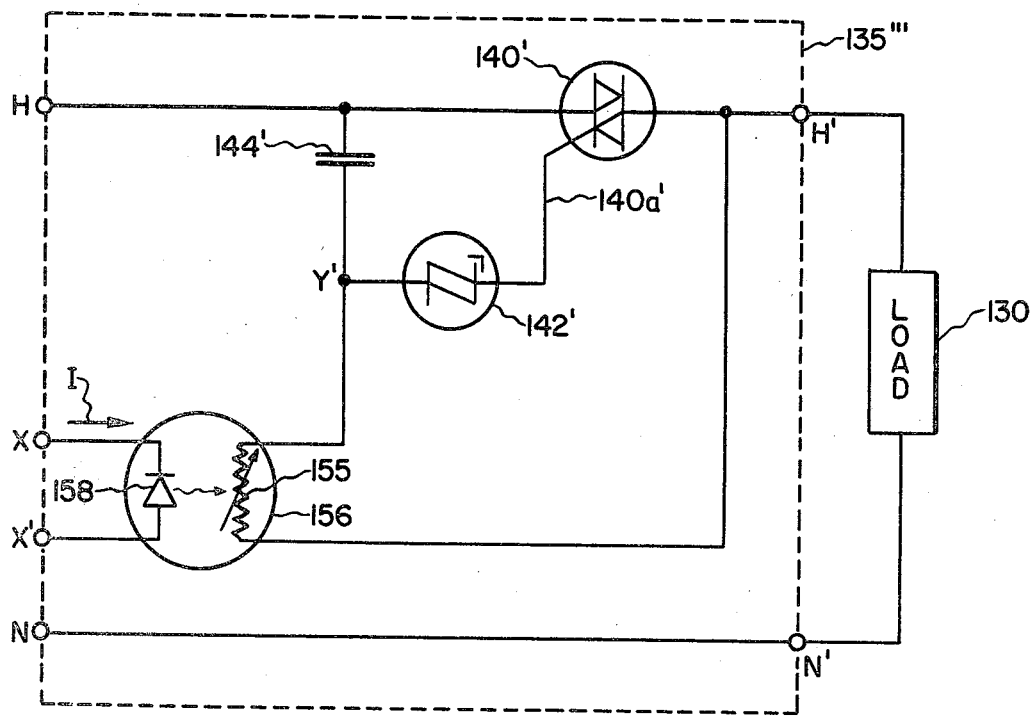

Referring now to FIG. 2d, another presently preferred embodiment of a variable average current control and switching means 135‴ uses the series gateable device 140′ connected between source control electrode 140a′ is connected through a trigger device 142′ to a capacitor 144′, at point ′Y. Point ′Y is connected to the load hot line connection H′ by a variable photoresistance element 155, forming a point of an optoelectronic isolation means 156. The isolator also includes a light-emitting source means 158, such as a light-emitting diode and the like, coupled between a pair of floating (isolated) control terminals X and X'. Diode 158 emits optical flux of magnitude responsive to the magnitude of an input current I, flowing between terminasl X and X'. The photoresistance element 155 intercepts at least a portion of the flux emitted by means 158 and provides a resistance, between points H' and Y', of magnitude controlled by the magnitude of the input signal (current I), itself provided by one of DAC means 129 or PWM means 128. This embodiment achieves a high degree of isolation between the control input and the load-controlling elements.

Figure 3A:
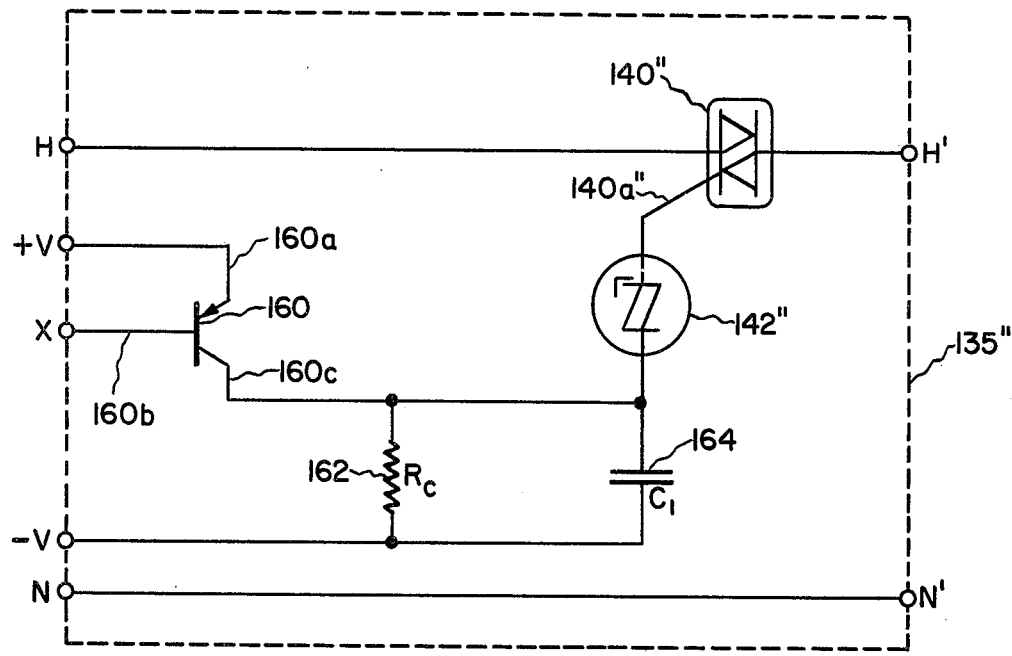
FIGS. 3a and 3b are schematic diagrams of other presently preferred load control and switching means for use in the system of FIG. 2.
Figure 3B:
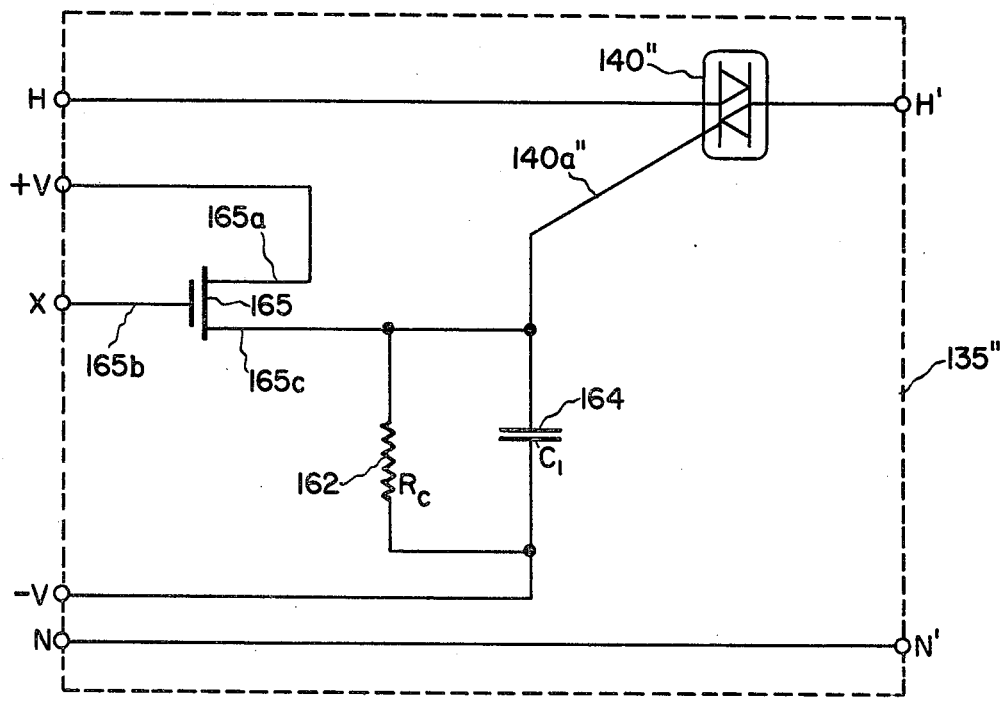

Other embodiments of variable average current and switching means 135 may be provided by utilizing only a single asymmetrically-conducting device, as shown in FIGS. 3a and 3b. In these embodiments of means 135''', the gateable series-pass semiconductor device 140'' is a triac, which, while not an asymmetrically-triggering device, may be triggered for either positive or negative voltage across the cathode-anode circuit (from hot input terminal H to hot output terminal H') thereof by means of a single-polarity voltage at the gate electrode 140a'' thereof, as the gate electrode triggering voltage levels are relatively close in magnitude for the two opposite polarities. A negative potential —V is made available at dimmer switching means 135, which negative potential may be provided by a D.C. voltage source associated with the D.C. potential source(s) required for providing operating potential to the PWM means 128 or DAC means 129, as well as to the logic circuitry utilized in UASRT 121, encoder-decoder means 122 and/or control means 124.

In FIG. 3a, a bipolar switching transistor 160 is illustratively of the PNP type, having its emitter electrode 160a connected to a source of positive operating potential +V. The transistor base electrode 160b is connected to control input X. The transistor collector electrode 160c is connected through a four-layer triggering device 142'' to the gate electrode 140a'' of the gateable device. The transistor collector electrode 160c is also connected, via a resistance element 162 of resistance value $R_C$, to a negative operating potential —V input. Resistor 162 is paralleled by a capacitor 164, of capacitance value $C_1$. Resistance 162 serves to discharge capacitance 164 and prevent false triggering of the gateable device 140''; this discharge function is provided in the symmetrical-switching embodiments of FIG. 2a-2c, by conduction in alternately opposed directions when the source voltage changes polarity in sequential half-cycles.

In FIG. 3b, an asymmetrically-conducting field-effect transistor 165 is utilized with its drain electrode 165a connected to the positive operating potential +V source. The transistor gate electrode 165b is connected to control input X. The transistor source electrode 165c is connected directly to the gate electrode 140a'' of the gateable device, and through the paralleled resistance 162-capacitance 164 circuit to negative operating potential —V. A four-layer trigger device is not required for this embodiment, providing a further reduction in switching means cost. Device 165 is a P-channel device.

In operation, the control voltage, at control input X, is provided by one of PWM means 128 or DAC means 129. The magnitude of the voltage provided by DAC means 129 is established such that the current flowing through the emitter-collector circuit of device 160 or the source-drain circuit of device 165, commences charging of capacitance element 164 at the beginning of each half-cycle of the source waveform. At some point in each source waveform half-cycle, the voltage across capacitance element 164 reaches a level sufficient to cause device 140'' to conduct current to the load connected between the controlled hot terminal H' and neutral terminal N'. At the end of the half-cycle, gateable device 140'' automatically resumes the nonconducting condition. Device 160 or 165 also become nonconductive. Simultaneously, discharge of capacitance element 164, occurs due to the presence of discharge resistance 162.

If PWM means 128 is utilized, the pulse output thereof is applied at control input X with an initial value such that semiconductive devices 160 or 165 cannot conduct, during an initial portion of each source waveform half-cycle. At some point during the source waveform half-cycle, a pulse amplitude charge occurs. The new amplitude is sufficient to cause rapid increase in current flow through that one of devices 160 or 165 utilized, into capacitance element 164. At that time, a "turn-on" signal appears at gateable device gate electrode 140a''' and causes conduction from the source to the load for the remainder of that half-cycle. Again, at the termination at a particular half-cycle, device 140'' ceases to conduct, and the voltage across capacitance element 164 is reduced by discharge resistance 162, whereby gate electrode 140a'' does not receive a sufficient high gating voltage to cause conduction thereof until next commanded by the supplying charge to capacitance element 164 to raise the voltage thereof to be greater than the gate electrode triggering voltage.

It should also be understood that the embodiments of FIGS. 2a–2d, 3a and 3b may be utilized as a simple on-off power switching circuit, if the input signal, at control point X, is restricted to: a first level selected to maintain the gateable device in the nonconductive, or "off condition; and a second level selected to be sufficiently high enough to assure that the gateable element will remain in the conductive, or "on", condition for substantially all of each source waveform half-cycle. Further, operation is unaffected by placement of the gateable device in the neutral leg, whereby the polarity of the input plug, as in appliance control applications, is not important. Thus any remotely-controlled power switching function, such as appliance outlet switching and the like, can be provided, as well as providing a variable load current amplitude when the current is switched "on". By remotely controlling both the on/off function and load power levels, preferably over a shared communications link, which may be a twisted wire pair, a coaxial cable, a powerline carrier, radio or optical link and the like, some or all of the electrical power consumption loads in a building and the like can be controlled for greater convenience and economy.

The heretofore described load switching means all require switching devices which will withstand and block both polarities of the A.C. line voltage, to peak amplitudes on the order of ±200 volts. The gateable device must also be a symmetrical switch which will pass both polarities of current; the gating circuit for this device will advantageously respond to a single polarity, low voltage signal (on the order of 5 volts peak, such as is obtained from digital logic).

As previously set forth hereinabove, a power supply 139 (see FIG. 2) for supplying an operating potential (such as positive polarity operating potential +V of FIGS. 3a and 3b) is preferably in effective series-connection with the load. Accordingly, standard transformer techniques cannot be used nor can resistive or capacitive voltage-dropping techniques be utilized to provide the control means operating potential from the relatively high-voltage A.C. source 138, due to the undesirable heat generation and/or physical bulk required. Suitable power supplies are described and claimed in copending application Ser. No. (181 813) filed on even date herewith, assigned to the assignee of the present application, and incorporated herein by reference. One such power supply 139, illustrated in FIG. 4a, has a supply input 139a connected to source hot line terminal H and a power supply output common terminal 139b connected to the load hot line output H' of the load control means 135. Input 139a is connected to the anode of a series-pass diode 185, having its cathode connected to a first terminal of a resistor 187 and to the collector electrode 189a of a series-pass transistor 189. The series-pass transistor base electrode 189b is connected to the remaining terminal of resistor 187, as is the anode of a silicon-controlled rectifier (SCR) 191. The SCR cathode is connected to power supply output common terminal 139b, as is one terminal of an output filter capacitance 193. The remaining terminal of capacitance 193 and the series-pass transistor emitter electrode 189c are connected to the power supply positive potential output 139c. The gate electrode of SCR 191 is connected to the anode of a zener diode 195, having its cathode connected to supply output terminal 139c.

In operation, at the start of each positive half-cycle of the source waveform, the gateable device 140, in load control and switching means 135', is initially nonconducting, whereby the instantaneous source voltage appears between load control and switching means hot line input H and load control and switching means hot line output H', and therefore between the power supply input 139a and power supply output common 139b. Diode 185 is forward biased. Resistance 187 is selected to cause transistor 189 to saturate, causing a current to flow into and rapidly charge output capacitor 193. Typically, capacitor 193 is charged to the voltage level required for the operating potential source (a magnitude of +V) for load control and switching means 135, with the charging taking place in 1 millisecond for a 60 Hz source waveform. The zener voltage of zener diode 195 is chosen to provide a firing signal to the gate electrode of SCR 191 when the voltage across capacitance 193 reaches the desired power supply output potential V. Upon firing, SCR 191 turns off transistor 189, causing cessation of current flow into capacitance 193. At the zero crossing between the positive and negative half-cycle of the source A.C. waveform, the SCR is reset. Diode 185 is reversed-biased during the negative polarity half-cycle of the source waveform, whereby power supply 139 operates only during each positive polarity source waveform half-cycle. Thus, the desired operating potential V is provided by a power supply having a very low duty-cycle, which allows almost all of the source power to be available to the control load 130. The power supply utilizes a relatively low power transistor which, being switched from fully saturated to fully cut-off, dissipates relatively little energy and produces relatively little heat. It should be understood that a negative operating potential may be equally as well supplied by power supply means 139, by the appropriate reversal of polarity of diodes 185 and 195, transistor 189 and SCR 191, such that the output capacitance is charged during the negative polarity source waveform half-cycle.

Figure 4A:
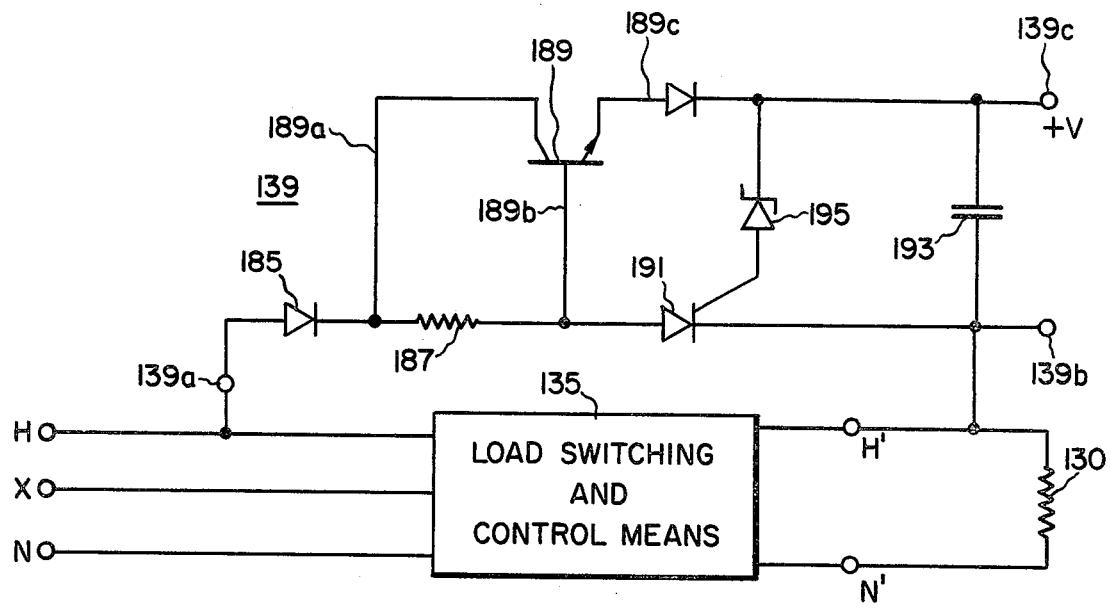
FIGS. 4a and 4b are schematic diagrams of power supplies for supplying D.C. operating potential to the load control and switching circuits.
Figure 4B:
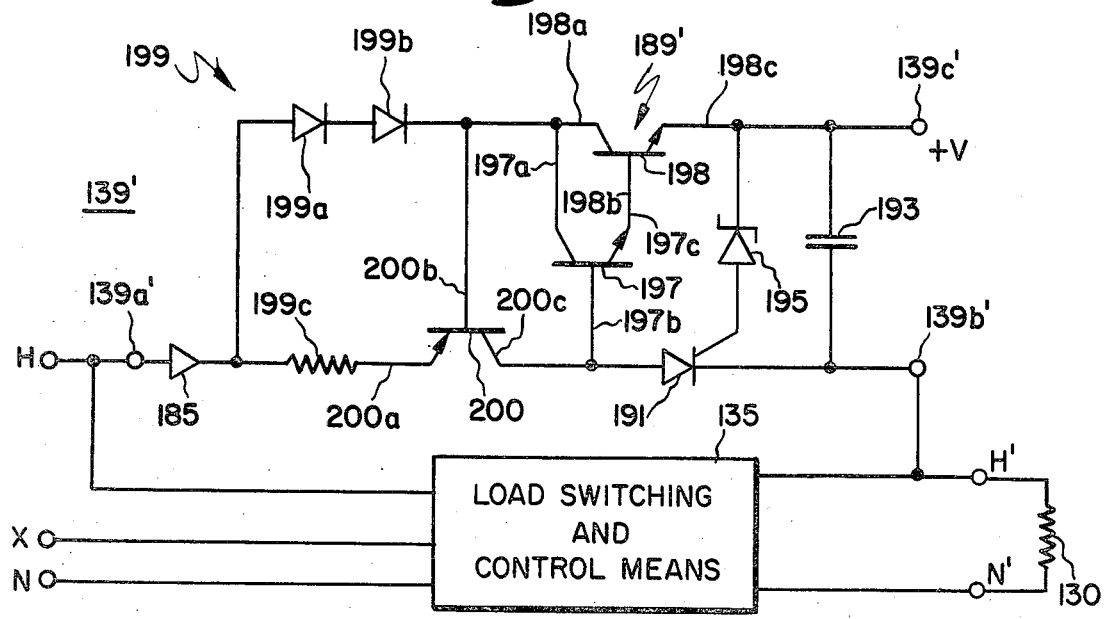

The power supply circuit of FIG. 4a is satisfactory for energizing operating loads having a power drain of less than about ¼ watt. In some embodiments of load control and switching means 135', a positive operating potential of about 8 volts, at an operating current of about 70 milliampes (or a power level of approximately ½ watt) is required. A medium-output-power-level power supply 139' is illustrated in FIG. 4b. Power supply input 139a' is connected to source hot line terminal H, while power supply output common connection 139b' is connected to controlled hotline output H'. Input diode 185, SCR 191, output capacitance 193 and zener diode 195 are connected as in the low-power-level power supply 139 of FIG. 4a. Due to the greater power level involved, series-pass transistor 189 is replaced by a series-pass Darlington transistor arrangement 189', having first and second transistors 197 and 198, respectively. The saturation resistance 187 is replaced by a current source 199 having a first diode 199a having its anode connected to the cathode of diode 185 and having its cathode connected to the anode of a second diode 199b. The cathode of diode 199b is connected to the parallel-connected collector electrodes 197a and 198a of transistors 197 and 198. One terminal of a resistance 199c is connected to the cathode of diode 185 and to the emitter electrode 200a of a PNP transistor 200. The base electrode 200b of current-source transistor 200 is connected to the junction between the cathode of diode 199b and collector electrodes 197a and 198a. The current-source transistor collector electrode 200c is connected to the anode of SCR 191 and to the base electrode 197b of transistor 197. The emitter electrode 197c of the first transistor in Darlington pair 189' as connected to the base electrode 198b of the second Darlington transistor 198. The second Darlington transistor emitter electrode 198c is connected to power supply output 139c'. Power supply 139' operates in manner similar to the hereinabove described operation of power supply 139, with diode 185 being forward biased during each positive source waveform half-cycle, whereby current source 199 supplies a current, to the Darlington pair base electrode 197b, of magnitudes sufficient to saturate both Darlington transistors and cause rapid charging of capacitance 193. The value of capacitance 193 is determined by the allowable power supply ripple voltage, in accordance with the formula C=Vr(I/F), where C is the value of capacitance 193 in farads, Vr is the allowable ripple voltage, I is the current drawn from the output of power supply 139', and F is the power line frequency (60 Hz). Charging of capacitance 193 continues until a voltage, set by the zener voltage of diode 195, is reached, whereupon SCR 191 is triggered and base drive is removed from the Darlington transistor pair 189', causing charging of capacitance 193 to terminate. The SCR returns to the nonconductive condition at the end of the positive half-cycle. Again, it should be understood that, while a positive voltage supply is shown, a negative operating potential supply may be equally as well implemented by reversing polarity of all semiconductive components, including diodes 185, 199a, 199b, and 195, transistors 197, 198 and 200 and SCR 191.

There has just been described several embodiments of circuitry for controlling the switching on and off as well as controlling the magnitude of power applied to each of at least one power-consuming loads.

Many variations and modifications will now occur to those skilled in the art. It is my intent, therefore, that I be limited only by the scope of the appending claims and not by the specific details presented herein.

What is claimed is:

1. A circuit for selectably connecting a power-consuming load to an A.C. source and for variably controlling load power consumption responsive to an externally-provided control signal, comprising:

first and second circuit terminals each for connection respectively to said source and said load;

a single input terminal for receiving said externally-provided control signal;

a gateable device having a gate electrode and a main circuit connected between said first and second terminals and having current conduction therethrough initiated responsive to a gating signal at said gate electrode;

a triggering device having a first terminal connected to said gateable device gate electrode at another terminal, and providing said gating signal at said gate electrode responsive to a voltage of a predetermined magnitude at said another terminal; and means connected to said input terminal, and including an energy-storage element connected between said trigger element another terminal and said first circuit terminal, for providing said voltage to said triggering device another electrode responsive to the control signal at said input terminal to vary both the occurrence and duration of gateable device conduction during each half-cycle of the waveform of said source;

said input terminal receiving a pulse-width-modulated analog signal, the pulse width of said analog signal determining the presence and magnitude of average current flow to said gateable device from said source to said load.

2. A circuit for selectably connecting a power-consuming load to an A.C. source and for variably controlling load power consumption responsive to an externally-provided control signal, comprising:

first and second circuit terminals each for connection respectively to said source and said load;

a single input terminal for receiving said externally-provided control signal;

a gateable device having a gate electrode and a main circuit connected between said first and second terminals and having current conduction therethrough initiated responsive to a gating signal at said gate electrode;

a triggering device having a first terminal connected to said gateable device gate electrode and another terminal, and providing said gating signal at said gate electrode responsive to a voltage of a predetermined magnitude at said another terminal; and means connected to said input terminal, and including an energy-storage element connected between said trigger element another terminal and said first circuit terminal, and a symmetrically-conductive device having a controlled-resistance circuit between said circuit second terminal and said trigger device another terminal and having a gate electrode connected to said input terminal for controlling the resistance of the controlled-resistance circuit of said device responsive to said control signal, for providing said voltage to said triggering device another electrode responsive to the control signal at said input terminal to vary both the occurrence and duration of gateable device conduction during each half-cycle of the waveform of said source.

3. The circuit of claim 2, further comprising first and second resistance elements each having a first end connected to the controlled-resistance circuit of said device and a second end respectively connected to an associated one of said first and second circuit terminals.

4. The circuit of claim 3, wherein said symmetrically-conductive device is a field-effect transistor having a drain-source circuit providing the controlled-resistance circuit, and a gate electrode connected to said input terminal for controlling the resistance of said drain-source circuit.

5. The circuit of claim 2, wherein said gateable device is a triac.

6. The circuit of claim 5, wherein said triggering device is a diac.

7. A circuit for selectably connecting a power-consuming load to an A.C. source and for variably controlling load power consumption responsive to an externally-provided control signal, comprising:

first and second circuit terminals each for connection respectively to said source and said load;

a single input terminal for receiving said externally-provided control signal;

a gateable device having a gate electrode and a main circuit connected between said first and second terminals and having current conduction therethrough initiated responsive to a gating signal at said gate electrode;

a triggering device having a first terminal connected to said gateable device gate electrode and another terminal, and providing said gating signal at said gate electrode responsive to a voltage of a predetermined magnitude at said another terminal; and means connected to said input terminal, and including an energy-storage element connected between said trigger element another terminal and said first circuit terminal, and first and second asymmetrically-conducting devices, each having a controlled-resistance circuit connected between said circuit second terminal and said trigger device another terminal, and each having a control electrode coupled in parallel to said control input for controlling the resistance of the controlled-resistance path of that device during an associated half-cycle of the waveform of said source, for providing said voltage to said triggering device another electrode responsive to the control signal at said input terminal to vary both the occurrence and duration of gateable device conduction during each half-cycle of the waveform of said source.

8. The circuit of claim 7, further comprising first and second unidirectionally-conducting devices each in series with the controlled-resistance path of a different one of said pair of devices, and so polarized as to allow conduction of current through the associated controlled-resistance path only in the normally-conductive direction thereof.

9. The circuit of claim 8, wherein each asymmetrically-conductive device is a field-effect transistor.

10. The circuit of claim 8, wherein the asymmetrically-conductive device is a bipolar transistor.

11. The circuit of claim 7, wherein said gateable device is a triac and said triggering device is a diac.

12. A circuit for selectably connecting a power-consuming load to an A.C. source and for variably controlling load power consumption responsive to an externally-provided control signal, comprising:

first and second circuit terminals each for connection respectively to said source and said load;

a single input terminal for receiving said externally-provided control signal;

a gateable device having a gate electrode and a main circuit connected between said first and second terminals and having current conduction therethrough initiated responsive to a gating signal at said gate electrode;

a triggering device having a first terminal connected to said gateable device gate electrode and another terminal, and providing said gating signal at said gate electrode responsive to a voltage of a predetermined magnitude at said another terminal; and means connected to said input terminal, and including an energy-storage element connected between said trigger element another terminal and said first circuit terminal, and further including means for providing first and second D.C. potentials of opposite polarity; an impedance network coupled between said trigger device another terminal and one of said first and second potentials; and a single asymmetrically-conducting device having a control electrode connected to said input terminal and a controlled-resistance circuit, connected between the other of said first and second potentials and said triggering device another terminal, and controlled by the signal at said control electrode for varying the voltage across said impedance network, for providing said voltage to said triggering device another electrode responsive to the control signal at said input terminal to vary both the occurrence and duration of gateable device conduction during each half-cycle of the waveform of said source.

13. The circuit of claim 12, wherein said impedance network includes an energy-storage element and a resistance element in parallel connection.

14. The circuit of claim 12, wherein said gateable device is a triac and said triggering device is a diac.

15. A circuit for selectable connecting a power-consuming load to a A.C. source and for variably controlling source and for variably controlling load power consumption responsive to an externally-provided control signal, comprising:

first and second terminals each for connection for a different one of said source and said load;

a single input terminal for receiving said externally-provided control signal;

a gateable device having a gate electrode and a main circuit, connected between said first and second terminals and having current conduction therethrough initiated response to a gating signal at said gate electrode;

means for providing first and second D.C. potential of opposite polarity;

an impedance network coupled between said gate electrode and one of said first and second potentials; and a single asymmetrically-conducting device having a control electrode connected to said input terminal and a controlled-resistance circuit, connected between the other of said first and second potential and said gate electrode, and controlled by the signal at said control electrode for varying the voltage across said impedance network, to vary both the occurrence and duration of gateable device conduction during each half-cycle waveform of said source.

16. The circuit of claim 15, wherein said impedance network includes an energy-storage element and a resistance element in parallel connection.

17. A circuit of claim 15, wherein said asymmetrically-conducting device is a field-effect transistor.

18. The circuit of claim 15, wherein said gateable device is a triac.

* * * * *